(12) United States Patent
Barak et al.

(10) Patent No.: US 10,311,198 B2
(45) Date of Patent: Jun. 4, 2019

(54) OVERLAY DESIGN OPTIMIZATION

(71) Applicant: NOVA MEASURING INSTRUMENTS LTD., Rehovot (IL)

(72) Inventors: Gilad Barak, Rehovot (IL); Tal Verdene, Hulda (IL); Michal Yachini, Rehovot (IL); Dror Shafir, Kiryat Ono (IL); Changman Moon, Seoul (KR); Shay Wolfling, Kiryat Ono (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 145 days.

(21) Appl. No.: 15/119,306

(22) PCT Filed: Feb. 16, 2015

(86) PCT No.: PCT/IL2015/050174
§ 371 (c)(1),
(2) Date: Aug. 16, 2016

(87) PCT Pub. No.: WO2015/121867
PCT Pub. Date: Aug. 20, 2015

(65) Prior Publication Data
US 2017/0061066 A1 Mar. 2, 2017

Related U.S. Application Data

(60) Provisional application No. 61/940,446, filed on Feb. 16, 2014.

(51) Int. Cl.
*G06F 17/50* (2006.01)
*G03F 7/20* (2006.01)
(Continued)

(52) U.S. Cl.
CPC ...... *G06F 17/5081* (2013.01); *G03F 7/70633* (2013.01); *G03F 7/70683* (2013.01); *G06F 17/5072* (2013.01); *G03F 7/70641* (2013.01); *H01L 21/0273* (2013.01); *H01L 21/67294* (2013.01); *H01L 29/66553* (2013.01)

(58) Field of Classification Search
CPC ............ G03F 7/70625; G03F 7/70633; G03F 7/70641; G03F 7/70683; G03F 17/5072; G03F 17/5081; H01L 21/0273; H01L 21/67294; H01L 21/68; H01L 29/66553
See application file for complete search history.

(56) References Cited

U.S. PATENT DOCUMENTS 6,204,912 B1 * 3/2001 Tsuchiya ............. G03F 7/70066
355/53
6,432,591 B1 * 8/2002 Baluswamy ............ G03F 7/706
257/797

(Continued)

*Primary Examiner* — Helen Rossoshek
(74) *Attorney, Agent, or Firm* — Browdy and Neimark, P.L.L.C.

(57) ABSTRACT

A sample comprising an overlay target is presented. The overlay target comprises at least one pair of patterned structures, the patterned structures of the pair being accommodated in respectively bottom and top layers of the sample with a certain vertical distance h between them, wherein a pattern in at least one of the patterned structures has at least one pattern parameter optimized for a predetermined optical overlay measurement scheme with a predetermined wavelength range.

13 Claims, 3 Drawing Sheets

(51) Int. Cl.
  *H01L 21/027* (2006.01)
  *H01L 21/67* (2006.01)
  *H01L 29/66* (2006.01)

(56) References Cited

U.S. PATENT DOCUMENTS

| | | | |
|---|---|---|---|
| 6,801,315 B2 | 10/2004 | Finarov et al. | |
| 6,974,962 B2 | 12/2005 | Brill et al. | |
| 6,985,229 B2* | 1/2006 | Lee | G01B 11/272 356/401 |
| 7,061,615 B1 | 6/2006 | Lowe-Webb | |
| 7,279,258 B2* | 10/2007 | Goodwin | G03F 1/44 382/145 |
| 7,532,317 B2* | 5/2009 | Smith | G01B 11/24 356/237.2 |
| 7,626,702 B2* | 12/2009 | Ausschnitt | G03F 7/70633 356/401 |
| 7,876,440 B2* | 1/2011 | Mieher | G01N 21/956 356/401 |
| 7,879,627 B2* | 2/2011 | Ghinovker | G03F 7/70633 257/E23.179 |
| 8,024,676 B2* | 9/2011 | Carcasi | G03F 7/70625 378/35 |
| 8,035,824 B2* | 10/2011 | Ausschnitt | B81C 99/0065 356/401 |
| 8,390,808 B1* | 3/2013 | Levinski | H01L 21/68 355/53 |
| 8,871,409 B2* | 10/2014 | Pforr | G03F 1/38 430/270.1 |
| 9,911,604 B1* | 3/2018 | Sun | H01L 21/0273 |
| 2002/0160284 A1* | 10/2002 | Baluswamy | G03F 7/706 430/30 |
| 2003/0091916 A1* | 5/2003 | Baluswamy | G03F 7/706 430/30 |
| 2006/0117293 A1 | 6/2006 | Smith et al. | |
| 2013/0208279 A1* | 8/2013 | Smith | G01B 11/26 356/401 |
| 2015/0177135 A1* | 6/2015 | Amit | G01N 21/47 702/150 |
| 2016/0047744 A1* | 2/2016 | Adel | G03F 7/70633 356/401 |
| 2016/0061589 A1* | 3/2016 | Bhattacharyya | G01B 11/14 356/620 |
| 2016/0117847 A1* | 4/2016 | Pandev | G06T 7/001 348/87 |
| 2016/0313116 A1* | 10/2016 | Ghinovker | G03F 7/70633 |
| 2018/0073866 A1* | 3/2018 | Tarabrin | G01B 11/272 |

\* cited by examiner

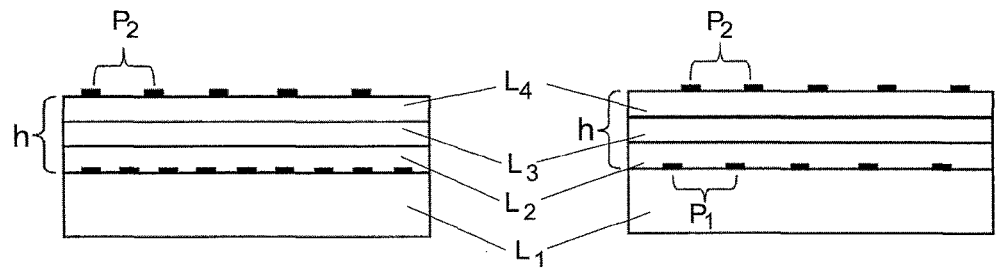
FIG. 3A  FIG. 3B
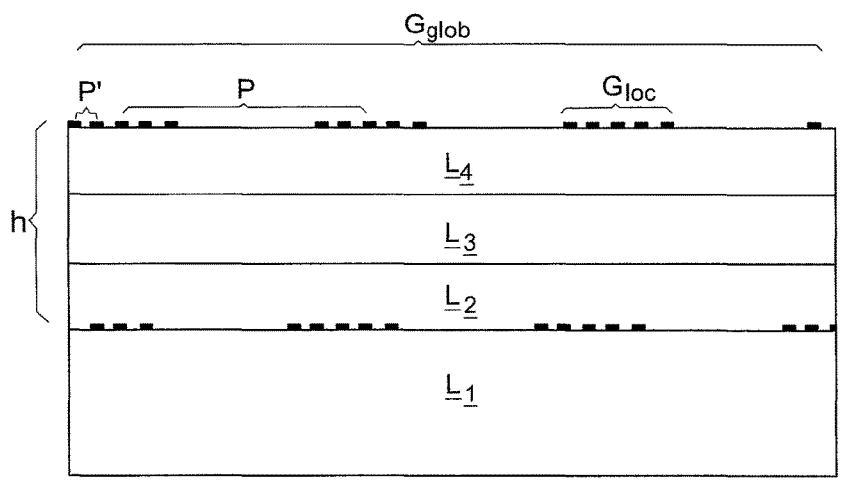
FIG. 4

OVERLAY DESIGN OPTIMIZATION

TECHNOLOGICAL FIELD

The present invention is in the field of overlay measurements in patterned structures, such as semiconductor wafers, and relates to an overlay target configuration and a method for optimizing the overlay targets.

BACKGROUND

Over the last decades, the field of optical lithography experienced rapid development allowing for semiconductor fabrication of increasingly smaller features. These developments require appropriate overlay metrology tools to allow accurate alignment of consecutively printed layers.

In addition, in order to enable decrease in pitch (distance between identical elements in a grating), advanced device designs involve novel attributes (e.g. large thicknesses, new materials). While crucial for the operation of the eventual device, these new designs often pose significant challenges to the overlay metrology, as they decrease the signal sensitivity to the overlay error.

Overlay measurement techniques have been developed based on proper design of overlay targets. This approach is disclosed for example in U.S. Pat. Nos. 6,801,315 and 6,974,962, both assigned to the assignee of the present application.

According to U.S. Pat. No. 6,801,315, the overlay measurement technique is performed by illuminating a sample with incident radiation, collecting the radiation response of the sample by an objective, splitting the collected radiation into two spatially separated radiation components, and directing the split radiation components towards at least one imaging plane along different optical channels characterized by optical paths of different lengths, respectively. Two image parts are thus obtained corresponding to the detected two split radiation components in the imaging plane(s), where each image part contains images of the two target structures. This enables determination of the relative distance between the two target structures.

According to U.S. Pat. No. 6,974,962, layers alignment in a multi-layer sample is controlled using two patterned structures located one above the other in two different layers, respectively, within a measurement site (e.g. a test site). The measurement site is illuminated with electromagnetic radiation thereby illuminating one of the patterned structures through the other, and a diffraction efficiency of radiation diffracted from the patterned structures is detected. The diffraction efficiency is indicative of a lateral shift between the patterned structures.

GENERAL DESCRIPTION

The present invention provides a novel overlay measurement methodology based on a target optimization, aimed at optimizing overlay measurements of patterns in layers relatively distant from one another, i.e. with a relatively thick layer structure between them.

As described above, overlay measurements in a patterned sample utilize an overlay target embedded in a sample under measurements, e.g. within a test site. The overlay target is a patterned structure formed by at least one pair of patterns (gratings), the two patterns of the pair being located in different layers of the sample.

The present invention is aimed at solving a problem arising in case of a relatively large vertical distance between the two layers containing the paired gratings. Common practice dictates that a pitch of pattern used for overlay targets is to be small as compared to the required overlay error accuracy. In other words, according to the conventional approach, the larger the error is relative to the pitch of the pattern, the stronger effect it has on the optical reflection properties of the structure. According to the conventional approach, a pitch of a few tens of nanometers is typically used.

However, the inventors have found that, when two layers are vertically separated by a relatively larger distance (greater than 100 nm), the conventional approach (i.e. overlay target in which a pattern has as small as possible pitch) provides insufficient sensitivity to the overlay errors and is hence inadequate as an overlay target solution. On the contrary, desirably high sensitivity is obtained only with overlay targets where the grating pitch is comparable to the vertical separation between the grating containing layers.

Generally, the inventors have found that one or more parameters of at least one pattern (grating) of the overlay target can be properly adjusted/optimized to obtain desirably high accuracy of the overlay measurements. Such parameter(s) include(s) a pitch and/or duty cycle of the pattern, and may also include the line heights, as well as variations between the top and bottom gratings. The inventors have also developed an overlay design optimization technique for designing the optimal overlay target mostly suitable for a certain overlay measurement scheme.

According to one abroad aspect of the invention, there is provided a sample comprising an overlay target comprising at least one pair of patterned structures, the patterned structures of the pair being accommodated in respectively bottom and top layers of the sample with a certain vertical distance h between them, wherein a pattern in at least one of the patterned structures has at least one pattern parameter optimized for a predetermined optical overlay measurement scheme with a predetermined wavelength range.

In some embodiments, the at least one pattern parameter comprises a pitch P of the pattern. For example, the pitch P of the at least one patterned structure may be approximately equal to the vertical distance h between the layers containing said patterned structures of the pair.

Preferably, the at least one optimized patterned structure includes at least the top layer structure.

In some embodiments, the at least one optimized patterned structure comprises a first global pattern in the form of spaced-apart features, where each of these features comprises a second local pattern, such that the pitch of global pattern is much larger than that of the local pattern. For example, the pitch P of the global pattern is approximately equal to the vertical distance h between the layers containing said patterned structures of the pair.

Additionally, the parameter(s) of the pattern to be optimized includes a duty cycle (the ratio between line width and the total pitch).

According to another broad aspect of the invention, there is provided a sample comprising an overlay target comprising at least one pair of patterned structures, the patterned structures of the pair being accommodated in respectively bottom and top layers of the sample with a certain vertical distance h between them, wherein a pattern in at least one of the patterned structures has a pitch P approximately equal to said vertical distance h between the bottom and top layers containing said patterned structures of the pair.

According to yet another aspect of the invention, there is provided a method for use in creating an overlay target in a patterned sample, the method comprising:

providing data about one or more floating parameters of the overlay target;

providing input data comprising data about at least one overlay measurement scheme; and data about layer structure of a sample in between top and bottom layers for carrying top and bottom patterned structures of the overlay target;

analyzing the input data and determining at least one operative wavelength range; and optimizing at least one of said one or more floating parameters for said at least one wavelength range.

The at least one patterned structure to be optimized is preferably the structure to be located in the top layer.

The one or more floating parameters of the pattern to be optimized include at least a pitch P of the pattern in at least one of the top and bottom patterned structures. The data about the layer structure of the sample includes at least a vertical distance between the top and bottom layers for carrying the top and bottom patterned structures. The optimizing of the at least one floating parameter may thus include optimizing a relation between the pitch P and said vertical distance h. For example, the pattern is optimized such that the pitch P is approximately equal to the vertical distance h. In some embodiments, this is achieved by malting the pattern such that it includes a first global pattern in the form of spaced-apart features arranged with the pitch P approximately equal to the vertical distance h, while each of the features comprises a second local pattern.

In some embodiments, a duty cycle of the pattern also presents a floating parameter to be optimized.

As indicated above, the sample may be a semiconductor wafer for carrying the overlay target.

The technique of the invention is general and applicable to any metrology system and any measurement scheme (Spectral reflectometry, Spectral ellipsometry, Mueller matrix metrology, dome scatterometry, SDM etc.).

More specifically, the invention is useful for overlay measurements in semiconductor wafers, and is therefore described below with respect to this specific application. However, it should be understood that the invention is not limited to this application as well as to any specific sample.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 2A presents the calculated overlay accuracy as a function of grating pitch, and FIG. 2B shows the calculated overlay accuracy as a function of duty cycle;

FIGS. 3A and 3B show two examples of the target utilizing the principles of the invention, where in FIG. 3A only top grating is optimized, and in FIG. 3B both the top and bottom gratings are optimized;

FIG. 4 shows another example of the overlay target according to the invention, in which the grating has a global large-pitch pattern of wide lines and spaces, where the wide lines are formed with a local small-pitch pattern.

DETAILED DESCRIPTION OF EMBODIMENTS

The present invention provides a novel overlay target configuration, enabling to optimize sensitivity of measurements of the overlay error in samples with relatively large vertical distance between the two patterned layers (of >100 nm).

Figure 1:
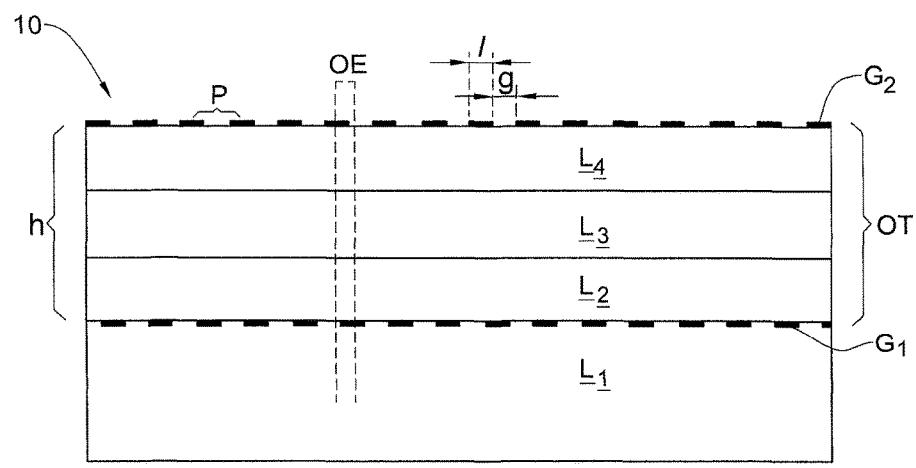
FIG. 1 shows a schematic sketch of a conventional overlay target embedded in a sample with relatively large distance between the grating containing layers.

In this connection, reference is made to FIG. 1, which shows a schematic sketch of the overlay target. More specifically, FIG. 1 illustrates a part (site) of a sample 10 (wafer), which is a multilayer stack including an overlay target OT embedded therein. The overlay target OT is formed by a pair (generally, at least one pair) of patterned structures (gratings) $G_1$ and $G_2$ which are located in (printed on) different layers—bottom $L_1$ and top layer $L_4$.

The gratings $G_1$ and $G_2$ of the overlay target OT are produced concurrently with patterning respective layers in the wafer. Overlay metrology measures a horizontal offset between these patterned structures $G_1$ and $C_2$, thus indicating the overlay error OE between layers $L_1$ and $L_2$.

In the situation exemplified in FIG. 1, the patterned structures $G_1$ and $G_2$ of the overlay target OT are separated by a large vertical distance h (e.g. about 1 µm or larger), while a pitch P of the pattern is typically of up to a few tens of nanometers. In this non limiting example, this separation is formed of three different layers $L_2$, $L_3$ and $L_4$, but of course can hold any number of layers, e.g. a single thick layer. With such a large vertical distance h, i.e. h>>P, measured reflection properties of the site 10 are insensitive to a small overlay error, i.e. OE<P/50.

The inventors have found that the overlay target can be optimized to significantly improve sensitivity to overlay errors. This optimization includes selecting one or more of the pattern features, such as the pitch P and/or duty-cycle D of at least one of the two patterns $G_1$ and $G_2$. The duty-cycle D is a line to period ratio l/(l+g), so that duty cycle D=0.5 means that the line and space have equal widths, l=g.

The inventors have performed overlay design optimization analysis. The overlay design optimization scheme includes several steps, which are based on modeling the spectral sensitivity for different target designs. The optimization makes use of standard optical calculation tools (e.g. RCWA, finite elements method, etc.) and optimization schemes (e.g. Simplex, Levenberg algorithms).

Figure 2A:
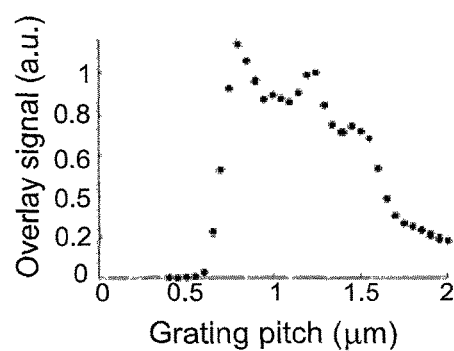
FIGS. 2A and 2B illustrate the optimization analysis for an overlay target large vertical separation between overlay gratings, where
Figure 2B:
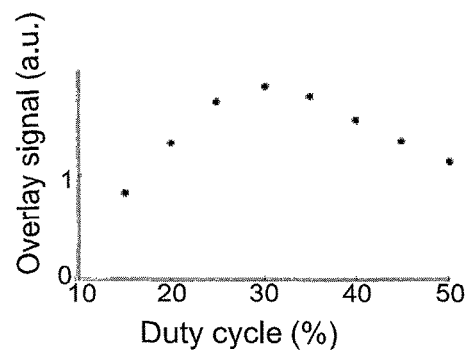

The optimization involves identifying the fixed application characteristics (those characteristics which cannot be modified to improve the overlay performance), and the floating characteristics (which can be controlled at will). Optimization is then performed on the floating characteristics, so as to obtain optimal sensitivity to overlay errors. Reference is made to FIGS. 2A and 2B exemplifying the optimization analysis performed by the inventors for an overlay target where vertical separation between overlay gratings is 1 µm. FIG. 2A presents the calculated overlay accuracy (detectable overlay error) as a function of grating pitch for such a target structure. It is found that using a very small grating pitch (P<<h) results in vanishing sensitivity to overlay errors. However, when using a grating with large pitch, similar to the vertical offset between the layers. i.e. P≈h, sensitivity can be drastically improved. FIG. 2B shows the calculated overlay accuracy as a function of duty cycle (in this case, calculated for the pattern with pitch of 0.8 µm).

It is shown that by using a duty cycle of 30%, sensitivity to overlay errors can be further increased significantly (in this example, almost two-fold).

It should be noted that common-practice design for the overlay target, dictating a pitch of a few tens of nanometers, results in negligible sensitivity to overlay errors and impractical requirements from the metrology tool. The overlay design optimization provides for improvement of sensitivity to overlay errors by factor 1000 and higher, allowing accurate metrology.

It should also be noted that such optimization can be applied to either one of the top and bottom patterns or both of them. While it is commonly beneficial to perform the optimization for both layers concurrently, in some cases consecutive optimization for each layer separately may be preferred.

FIGS. 3A and 3B show two specific but not limiting examples of the overlay target 10 formed by a pair of gratings $G_1$ and $G_2$ located in two layers with a relatively large distance h between them. In the example of FIG. 3A, only one of the gratings, top grating $G_2$, is optimized to improve overlay measurements. The optimization parameters is the pitch of the pattern, such that $P_2 \approx h$. In the example of FIG. 3B, both the top and bottom gratings are optimized, $P_1 \approx P_2 \approx h$.

It should be noted that, generally, a broad variety of application parameters can be considered for the optimization, depending on fabrication restrictions. In addition to the above mentioned pitch and duty cycle parameters, the optimization can account for grating line heights, variations between the top and bottom structures, etc.

It is furthermore possible to design the overlay target so as to allow overlay metrology in one direction (using a simple line\groove grating), with a similar overlay structure aligned perpendicularly, allowing overlay optimization in the other direction. Alternatively, a single grating structure can be used for overlay metrology in both directions (e.g. using a 2-D grating of small rectangular/square structures).

In some cases, changing the grating pitch is not allowed, as it is determined by details of the fabrication process. Such is the case when multiple-patterning techniques are used. For example, with self-aligned double patterning, the line thicknesses are dictated by the remaining spacer width after etch. In this case, it is still possible to apply overlay design optimization to improve overlay measurements. In this case, instead of using a large-pitch wide grating lines, the wide grating lines may be in the form of a set of small-pitch lines. In other words, the grating has a global large-pitch pattern of wide lines and spaces, where the wide lines are formed with a local small-pitch pattern. In this connection, reference is made to in FIG. 4 exemplifying overlay design optimization for a situation when the grating pitch is determined by process restrictions (e.g. multiple patterning). A large-pitch P global pattern $G_{glob}$ can be designed, constructed from building blocks of the allowed small-pitch P' local pattern $G_{loc}$.

Figure 5:
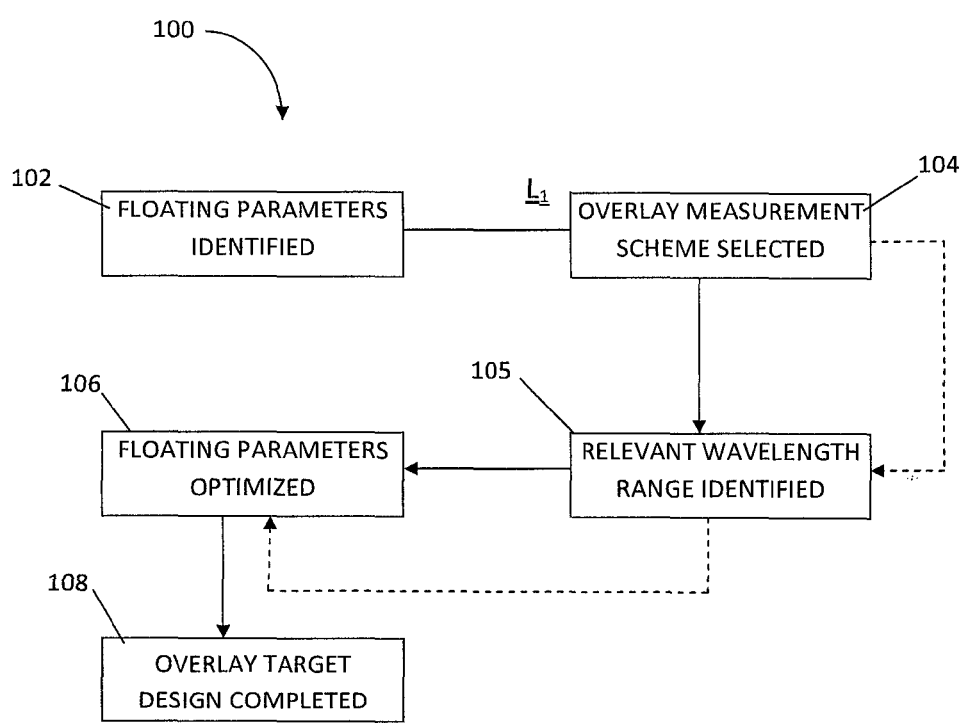
FIG. 5 exemplifies a flow diagram of the overlay design optimization according to the invention.

Reference is now made to FIG. 5 exemplifying a flow diagram 100 of the overlay design optimization procedure according to the invention to design an optimized overlay target for overlay measurements in a patterned sample.

The floating application parameters are identified, as distinguished from the dictated parameters (step 102). The dictated parameters are those determined by external considerations, and cannot be modified to optimize the overlay metrology. Such parameters may include the stack structure (layers $L_2$, $L_3$ and $L_4$) between the top and bottom overlay structures $G_1$ and $G_2$, material compositions used in the sample, etc. Conversely, floating parameters can be modified at will. As indicated above, floating parameters include pattern parameters such as pitch, duty cycle, etc. As also described above, in case the pattern pitch cannot be modified, this pitch is maintained within a local pattern within a line (feature) of a global pattern, whose parameters can be adjusted by optimization.

Then, preliminary analysis is performed. This includes selection of an overlay measurement scheme (step 104) and identification of a relevant wavelength range (step 105) for the selected overlay measurement scheme. This may be needed because the thick layers between the two structures of the overlay target can be strongly absorbing to specific spectral ranges, which therefore cannot be used for the overlay metrology. The optimization procedure is to be done based on relevant spectral range.

The floating parameters are optimized to obtain maximal sensitivity (step 106). This procedure assumes some specific metrology scheme (e.g. spectral reflectometry or ellipsometry), and is aimed at identifying the floating parameters' values which would provide best sensitivity to overlay errors. For example, using this procedure one would obtain the specific values of pitch and duty cycle which provide the best sensitivity to overlay errors.

After the initial optimization is done, it is possible to reconsider the spectral range used for the measurement (step 108). Wavelengths providing poor sensitivity to overlay errors can be disregarded in favor of valuable wavelengths. Upon changing the spectral range, another iteration of optimization can be done (step 106), now considering the improved spectral range. This process can be repeated until reaching an optimal solution (step 108).

Furthermore, it is possible to repeat the process considering different metrology schemes. For example, different polarizations can be considered for illumination and collection, as well as different incidence directions (if the measurement system allows such flexibility). Identification of the optimal metrology scheme and overlay target design can be done concurrently, or through an iterative process by which different measurement methods are considered and optimal targets are found for each.

The invention claimed is:

1. A sample comprising an overlay target comprising at least one pair of patterned structures, the patterned structures of the pair being top and bottom patterned structures arranged in respectively a top layer of the sample and one of underneath layers of the sample with a certain vertical distance h between them, wherein a pattern in at least one of the patterned structures is configured as a global pattern $G_{glob}$ formed by spaced-apart global features arranged with a pitch P approximately equal to said vertical distance h, wherein each of the global features of the global pattern is configured as a building block of a local pattern $G_{loc}$ of spaced-apart local features arranged with a predefined pitch value P', at least one pattern parameter of said at least one of the patterned structures being optimized for a predetermined optical overlay measurement scheme with a predetermined wavelength range.

2. The sample according to claim 1, wherein said at least one pattern parameter being optimized comprises a value of said pitch P of the global pattern $G_{glob}$, while maintaining said predefined pitch value P'.

3. The sample according to claim 1, wherein said at least one patterned structure is located in the top layer of the sample.

4. The sample according to claim 1, wherein said at least one pattern parameter being optimized comprises a duty cycle of the global pattern.

5. The sample of claim 1, being a semiconductor wafer carrying said overlay target.

6. The sample according to claim 1, wherein said distance h is of about 1 µm, and the pitch P is about 0.8 µm.

7. The sample according to claim 1, wherein a duty cycle of the first global pattern is about 30%.

8. A semiconductor wafer structure comprising an overlay target comprising at least one pair of patterned structures, the patterned structures of the pair being top and bottom patterned structures arranged in respectively a top layer of the wafer structure and one of underneath layers of the wafer structure with a certain vertical distance h between them, wherein a pattern in at least one of the patterned structures is configured as a global pattern $G_{glob}$ formed by spaced-apart global features arranged with a pitch P approximately equal to said vertical distance h, wherein each of the global features of the global pattern is configured as a local pattern $G_{loc}$ of spaced-apart local features arranged with a predefined pitch value P', at least a value of said pitch P of the global pattern $G_{glob}$ being selected for a predetermined optical overlay measurement scheme, requiring to maintain said predefined pitch value P'.

9. The sample according to claim 8, wherein said distance h is of about 1 µm, and the pitch P is about 0.8 µm.

10. The sample according to claim 8, wherein a duty cycle of the first global pattern is about 30%.

11. A sample comprising an overlay target comprising at least one pair of patterned structures, the patterned structures of the pair being top and bottom patterned structures arranged in respectively a top layer of the sample and one of underneath layers of the sample with a certain vertical distance h between them, wherein at least one of the patterned structures of the pair comprises a first global pattern in the form of spaced-apart global features of the first global pattern which are arranged with a pitch P approximately equal to said vertical distance h and each of said global features of the global pattern is configured as a building block of a second local pattern of spaced-apart local features arranged with a predefined pitch value P'.

12. The sample according to claim 11, wherein said distance h is of about 1 µm, and the pitch P is about 0.8 µm.

13. The sample according to claim 11, wherein a duty cycle of the first global pattern is about 30%.

* * * * *